United States Patent
Wallquist

(10) Patent No.: US 7,187,193 B2
(45) Date of Patent: Mar. 6, 2007

(54) MCU TEST DEVICE FOR MULTIPLE INTEGRATED CIRCUIT CHIPS

(75) Inventor: Kenneth Michael Wallquist, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 65 days.

(21) Appl. No.: 10/881,623

(22) Filed: Jun. 30, 2004

(65) Prior Publication Data
US 2006/0004533 A1    Jan. 5, 2006

(51) Int. Cl.
*G01R 27/28* (2006.01)
(52) U.S. Cl. ............................ 324/765; 324/755
(58) Field of Classification Search ............ 324/73.1, 324/760–765, 158.1; 340/535; 714/725, 714/730–735, 736
See application file for complete search history.

(56) References Cited

U.S. PATENT DOCUMENTS

| | | | | |
|---|---|---|---|---|
| 4,380,070 A | * | 4/1983 | Steiner | 340/537 |
| 4,539,517 A | * | 9/1985 | Flora | 714/735 |
| 4,768,195 A | * | 8/1988 | Stoner et al. | 714/736 |
| 5,163,052 A | * | 11/1992 | Evans et al. | 714/31 |
| 5,898,704 A | * | 4/1999 | Kawano | 714/727 |
| 6,622,272 B1 | * | 9/2003 | Haverkamp et al. | 714/725 |

* cited by examiner

*Primary Examiner*—Vinh P. Nguyen
(74) *Attorney, Agent, or Firm*—Howison & Arnott, L.L.P.

(57) ABSTRACT

A testing device for testing integrated circuits is disclosed including a first board configured to connect to a specific integrated circuit being tested. A second board is removably connected to the first board and is configurable to test a variety of integrated circuits. An MCU located on the second board controls the testing of the specific integrated circuit being tested. At least one connector enables connection between the first board and the second board.

47 Claims, 4 Drawing Sheets

MCU TEST DEVICE FOR MULTIPLE INTEGRATED CIRCUIT CHIPS

TECHNICAL FIELD OF THE INVENTION

The present invention relates to chip testers, and more particularly, to an MCU based test device for testing a variety of integrated circuits.

BACKGROUND OF THE INVENTION

In the manufacture of integrated circuit devices, there is a need to test the integrated circuits once they have been manufactured to confirm that all of the circuitry within the integrated circuit is operating according to its design parameters. This has required the development of various test devices to test the functionality of a manufactured integrated circuit. The problem with many existing test devices is that they are only applicable to a particular integrated circuit or family of integrated circuits. An integrated circuit, or family of integrated circuit, has particular functionalities and parameters associated therewith when operating correctly. A test device is designed that may have one of these integrated circuits placed within the test device and then electrically tests all of the relevant parameters and functions that must be tested on the chip. The test device provides a generic interface for testing a wide variety of integrated circuits, but at a very steep cost of entry (upwards of $2,000,000). This makes the testing device rather expensive and cost inefficient. Thus, it is difficult to use this type of test device on lower cost devices due to the high cost of the testing device. Thus, there is a need for an improved integrated circuit testing device which may test a wider variety of integrated circuits than existing testers are capable of testing. This more flexible approach to integrated circuit testing would find wide applicability within the integrated circuit manufacturing industry.

SUMMARY OF THE INVENTION

The present invention disclosed and claimed herein, in one aspect thereof, comprises a testing device including first and second boards. The first board is configured to connect to a specific integrated circuit that is being tested. The second board is removably connected to the first board via at least one connector and is configurable to test a plurality of integrated circuits. An MCU located on the second board controls the testing of the specific integrated circuit being tested.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
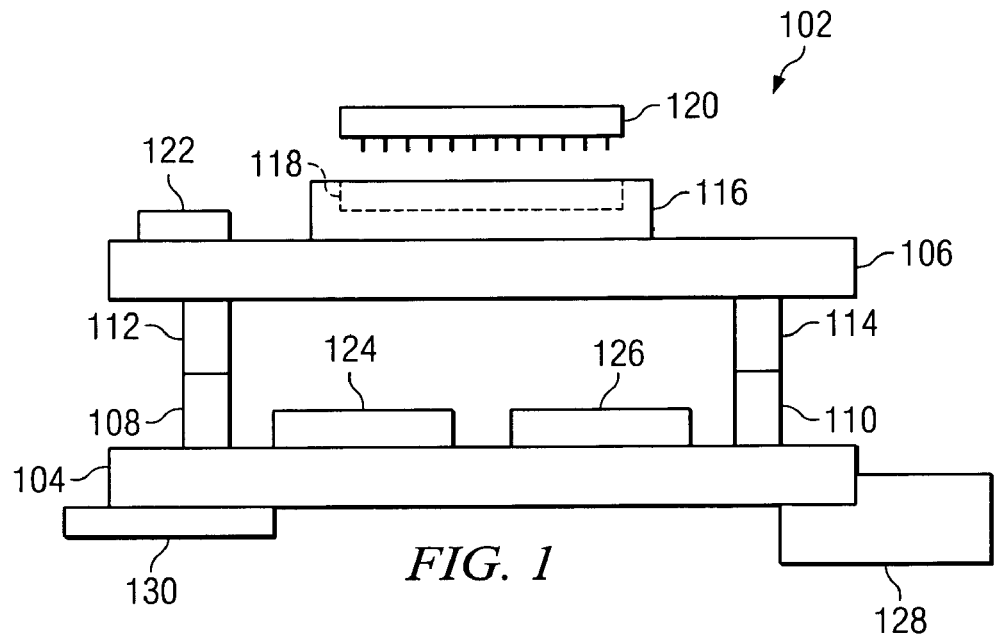
FIG. 1 is a side view of the MCU test device.

Referring now to the drawings, and more particularly to FIG. 1, there is illustrated a side view of the MCU test device of the present invention. The test device 102 includes a mother board 104 and a device board 106. The mother board 104 and device board 106 each have a pair of connectors associated therewith for interconnecting the mother board 104 with the device board 106. The mother board 104 includes connectors 108 and 110 that correspondingly mate with connectors 112 and 114 on the device board 106. In one embodiment, the connectors 108 and 112 on one side of each of the mother board 104 and device board 106 may be of a different size than the connectors 114 and 110 on the opposite side of the device board 106 and mother board 104. In this manner, it is always easy to connect the mother board 104 with the device board 106 in the proper alignment.

Included on the device board 106 is a contacter module 116. The contacter module 116 is connected with the device board 106 and defines therein a cavity 118 for receiving a particular integrated circuit device 120. In the preferred embodiment, the integrated circuit 120 will comprise some type of micro-controller unit that is being tested. The cavity 118 is configured to have a size and pin receptacle configuration for receiving a particular type of integrated circuit 120. Thus, the contacter module 116 will only be configured for a single type or family of integrated circuits. Additionally, the device board 106 includes a flash memory 122. The flash memory 122 contains integrated circuit specific device information that identifies the integrated circuit 120 being tested. The flash memory 122 is an identification chip which the mother board 104 can query to determine the type of device board 106 that is installed. The identification can then be relayed to a host application on a PC on the other end of a connected USB cable to determine if the correct device board 106 is installed for the product to be tested. In an alternative embodiment, the flash memory could also include testing procedures and parameters for use in the testing procedures. Any device board 106 is interchangeable with a mother board 104. Device boards 106 will be integrated circuit device specific. Thus, a single testing device 102 would include a single mother board 104 but will require multiple device boards 106 in order to be able to test a number of different types of integrated circuit devices 120. However, due to the simplicity of the device board 106 including only the contacter module 116 configured for a particular type of integrated circuit, connectors 112 and 114 and a flash memory 122 containing device specific testing instructions, the cost of the device board 106 is minimized. In addition, device board 106 may be configured to interface mechanically with different types of contacter module 116 and device handlers in order to be adapted to many kinds of test equipment without affecting the mother board 104.

The mother board 104 includes the common circuitry that is utilized for testing any number of integrated circuit devices 120. The micro controller unit (MCU) 124 may be programmed to test any type of integrated circuit 120 that is connected to the mother board 104 via the device board 106. The identification of the particular integrated circuit 120 will be provided to the mother board 104 from the flash memory 122 on the device board 106. An UMA 126 is used for providing a USB bridge between a USB connection 130 and the MCU 124. A power connector 128 provides a connection for providing power to the mother board 104 and the device board 106. It will provide via known power circuitry connections. A USB connecter 130 provides a universal serial bus connection to the MCU device tester 102 for connecting a PC or other device that can provide testing procedure and parameters to the mother board 104.

Figure 2:
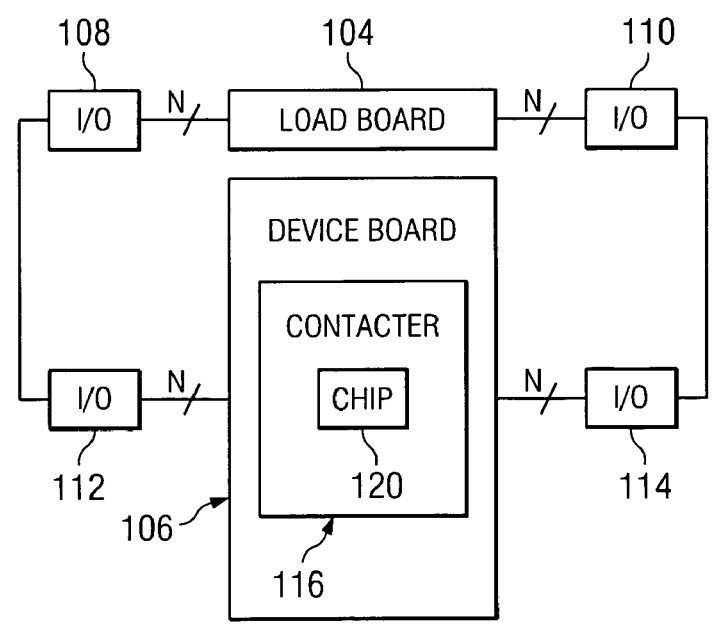
FIG. 2 is a block diagram illustrating the connections between a mother board and a device board.

Referring now to FIG. 2, there is illustrated the interconnection between the mother board 104 and the device board 106. The mother board 104 is connected to a pair of input/output connecters 108 and 110. These input/output connecters 108 and 110 provide a number of line connections between the input/output devices 108 and 110 and the mother board 104. Each of the input/output devices 108 and 110 interface with a corresponding input/output device 112 and 114 on the device board 106. The input/output connecters 112 and 114 of the device board 106 likewise provide a number of pin connections for connecting lines between the input/output connecters 112 and 114 and the device board 106.

Figure 3:
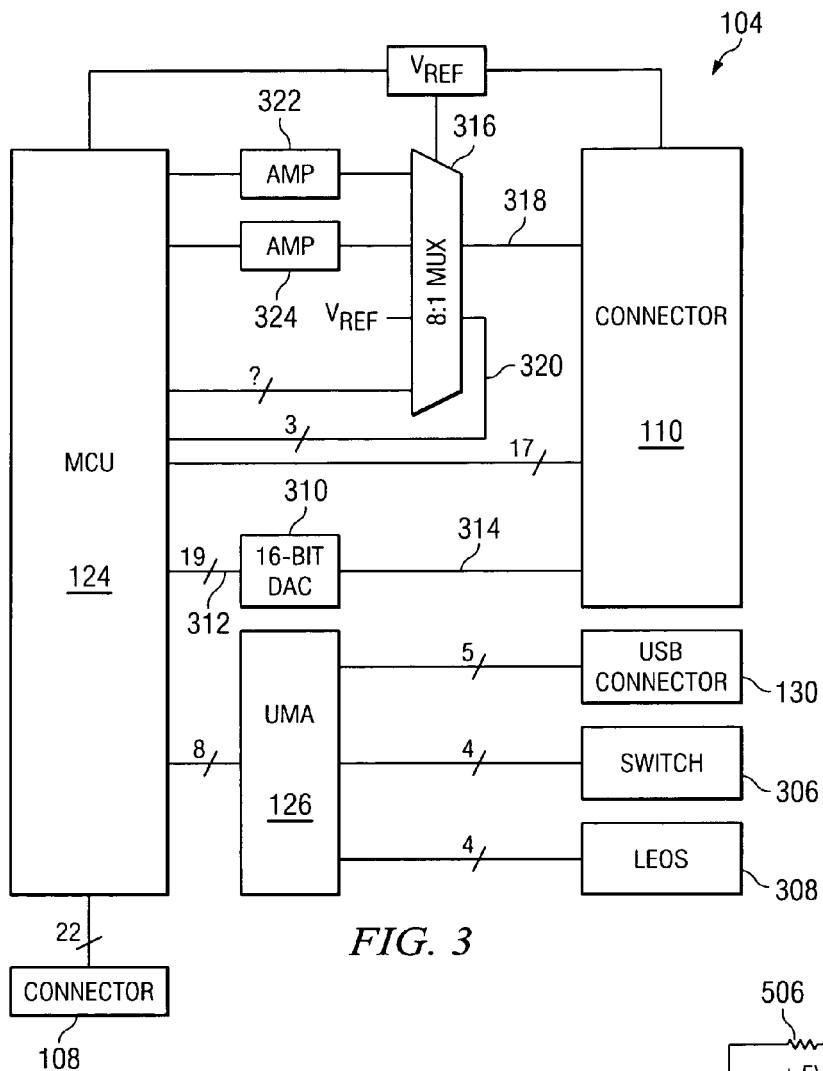
FIG. 3 is a block diagram of the mother board for testing an integrated circuit device.

Referring now to FIG. 3, there is illustrated a functional block diagram of the mother board 104. Digital and analog signals pass into and out of the mother board 104 through a pair of connecters 108 and 110. As mentioned previously with respect to FIG. 1, in a preferred embodiment, each of the connecters 108 and 110 may be of a different size such that when connecting each of the connecters 108 and 110 of the mother board 104 with a corresponding connecter on the device board 106, the proper alignment of the connecters 108 and 110 may always be determined. Each of the connecters 108 and 110 provide a number of direct connections to the micro controller unit 124. The micro controller unit 124 performs all of the test functions on an integrated circuit in the device board 106 as instructed by the instructions provided over the USB connection 130. In one embodiment, the MCU 124 comprises a C8051F120 device manufactured by Silicon Laboratories, Inc.

Figure 4A:
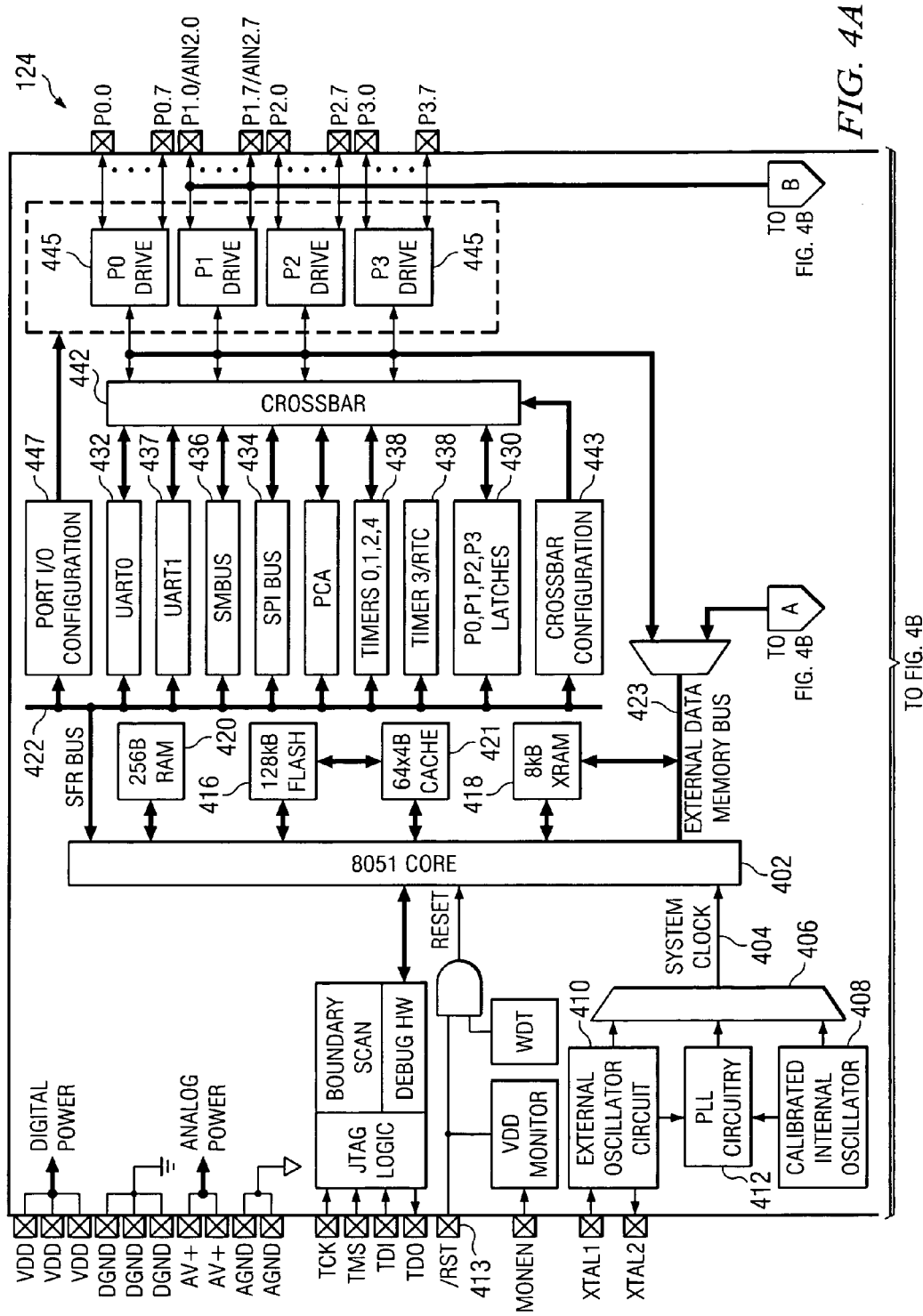
FIG. 4 is a functional block diagram of the MCU of the mother board.
Figure 4B:
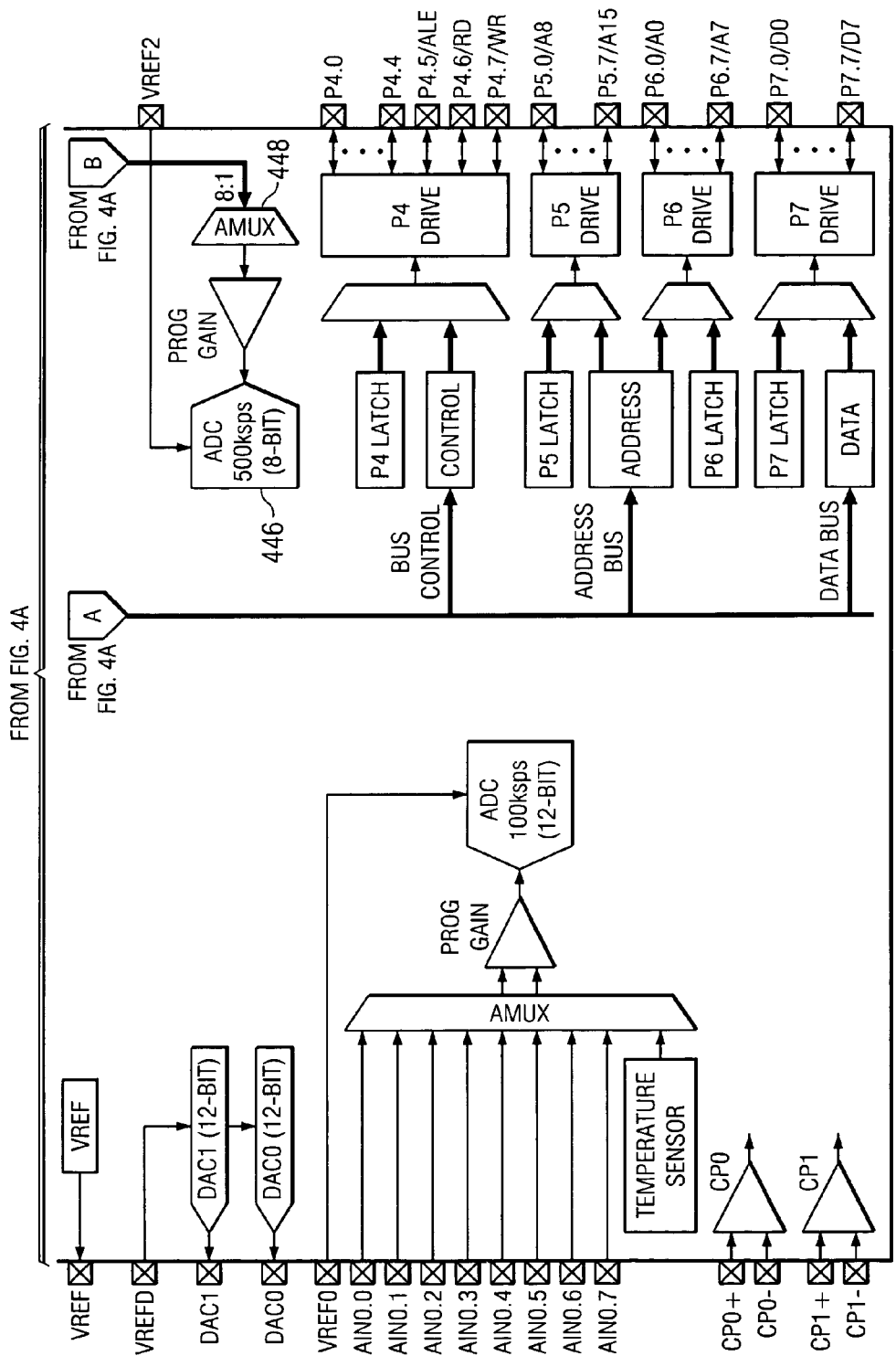

Referring now to FIG. 4, there is illustrated a block diagram of the MCU 124. As noted herein above, this is a conventional operation of, for example, a part No. C805F120 manufactured by Silicon Laboratories Inc. The MCU 124 includes in the center thereof a processing core 402 which is typically comprised of a conventional microprocessor of the type "8051." The processing core 402 retrieves a clock signal on line 404 from a multiplexer 406. The multiplexer 406 is operable to select among multiple clocks. There is provided a signal to the multiplexer 406 from an internal oscillator 408 and an external oscillator 410, each of which are connected to a phase lock loop 412. The processing core 402 has associated therewith a plurality of memory resources, those being a flash memory 416, an XRAM memory 418, a random access memory 420 and a cache memory 421. The flash memory 416 on the MCU 124 allows downloading from a host computer of the test sequences to be applied to the device under test (test program), which will be stored in the MCU flash and survive power cycles. The processing core 402 interfaces with various digital circuitry on the MCU 124 through an on-board digital bus 422, which allows the processing core 402 to interface with the various operating pins 426 that can interface external to the chip to receive values necessary for performing the test functionalities. These values may include digital values, output digital values, receive analog values or output analog values. Additional access to external devices may be provided through an external data memory bus 423. Various digital I/O circuitry are provided, these being serial interface circuitries, such as UART 232, 233, and SPI circuit 434 or an SMBus interface circuit 436. A number of timers and a real time clock 438 are provided in addition to a number of latch circuits 430. All of the circuitry 430 through 438 are interfacable to the pins 426 through a crossbar device 442. The crossbar device is configurable to interface these devices to select ones of the pins 476 responsive to inputs from the crossbar configuration circuit 443. The pins 426 are additionally driven by a number of pin drivers 445, responsive to the port I/O configuration circuit 447. The digital inputs/outputs can also be interfaced to the digital output of an analog-to-digital convertor 446 that receives analog input signals from an analog multiplexer 448 interfaced with a plurality of the input pins on the integrated circuit. The analog multiplexer 448 allows for multiple outputs to be sensed through the pins 426 such that the ADC 446 can be interfaced to various devices.

Referring now back to FIG. 3, the mother board 104 additionally includes an UMA bridge 126 enabling communication between the MCU 124 and universal serial bus connecter 130. The UMA bridge 126 enables communication with the MCU 124 using conventional a synchronous serial data. In one embodiment the UMA bridge 126 may comprise a C8051F321 device manufactured by Silicon Laboratories Inc. The UMA 126 additionally connects to a number of switches 306. The purpose of the site selection switches 306 is to identify to the host application the test site that the tester will be. This allows multiple instances of the testers to be present on the USB bus of the host computer to be addressed individually. This has usefulness for parallel device test, where device handlers capable of processing multiple integrated circuits simultaneously can be tested concurrently. A practical limit of 32 instances of the testers can be added to a single machine. The UMA 126 also connects with a number of LEDs 308, providing a visual indication to an individual of various conditions occurring in the test device. These conditions include but are not limited to a pass condition, a fail condition, the status of a particular link, whether or not a link is busy, and whether power is activated. The use of USB allows many advanced capabilities to the tester, such as notification of plug-in or unplugging, the connection of multiple testers to the same host computer with cheap USB hubs, and high bandwidth for transmitting large packets of data between the tester and the host computer.

A 16-bit digital-to-analog convertor (DAC) 310 is connected to the MCU 124 to receive a number of digital inputs via connections 312. The digital signals provided from the MCU 124 to the 16-bit DAC 310 via lines 312 enable the generation of a high precision analog signal by the 16-bit DAC 310. The high precision analog signal may then be output to connector 110 via line 314 and provided to the integrated circuit 120 being tested. The creation of a precision analog signal is important in various test applications since the digital-to-analog controllers provided internally within the MCU 124 are only 12-bits, and thus, insufficient for providing the precision analog signals necessary for testing some integrated circuits. The input lines 312 to the 16-bit DAC 310 include 16 digital data lines and 3 control lines for generating the analog output on line 314.

An eight-to-one multiplexer 316 provides the ability to switch a number of connections from the micro controller unit 124 to a single output line 318 connected to connecter 110. The eight-to-one multiplexer 316 provides the ability for the MCU 124 to provide either digital or analog output signals to an integrated circuit 120 on the device board 106 depending on the selected input of MUX 316. Selection of the input/output of the multiplexer 316, which is applied to line 318, is accomplished via a set of three input lines 320. The input lines 320 are used by the MCU 124 to make a selection at the MUX 316. One of the connections of the multiplexer 316 goes to a precision voltage reference VREF.

Two of the connections are connected between the MCU 124 and multiplexer 316 through amplifiers 322 and 324. The amplifiers amplify low voltage and low current analog signals that are being provided by the multiplexer 316. The remaining pins of the eight-to-one multiplexer 316 are connected to connector 110.

Figure 5:
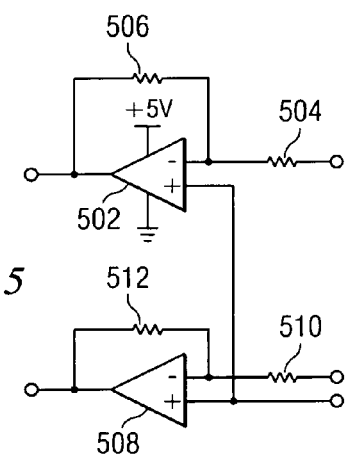
FIG. 5 is a schematic of amplifiers connected between the multiplexer and the mother board.

Referring now also to FIG. 5, there is provided a more detailed description of the amplifiers 322 and 324. Amplifier 322 consists of an OP Amp 502 having a connection to +5V and ground. The inverting input of the OP Amp 502 is connected to a first end of resistor 504. The second end of resistor 504 is connected to a pin of the eight-to-one multiplexer 316. Connected between the output of the OP Amp 502 and the inverting input of the OP Amp 502 is a second resistor 506. The output of the OP Amp 504 is connected to the MCU 124. The non-inverting input of OP Amp 504 is connected to the non-inverting input of OP Amp 508 of amplifier 324. The inverting input of OP Amp 508 is connected to a first end of resistor 510. The second end of resistor 510 is connected to another pin of the eight-to-one multiplexer 316. Connected between the inverting input of OP Amp 508 and the output of OP Amp 508 is another resistor 512. The output of OP Amp 508 is also connected to the MCU 124.

Using the above-described MCU based testing device, a single generic mother board 104 may be used interchangeably with a number of device boards 106 to enable the testing of a wide variety of integrated circuits such as micro controller units. The ability to utilize a same generic mother board 104 and only interchanging the device board 106 provides a great cost savings for the testing device that is a great advantage over existing testing devices. Mother board 104, with its complexity, can be built for much cheaper than a standard tester and may be replaced quickly in the case of damage.

Although the preferred embodiment has been described in detail, it should be understood that various changes, substitutions and alterations can be made therein without departing from the spirit and scope of the invention as defined by the appended claims.

What is claimed is:

1. A testing device, comprising:
a first board configured to connect to a specific integrated circuit being tested;
a second board removably connected to the first board and configurable to test a plurality of integrated circuits;
an MCU located on the second board for controlling the testing of the specific integrated circuit being tested; and
at least one connector for connecting the first board to the second board.

2. The testing device of claim 1, wherein the first board further includes a module connected to the first board, said module defining a cavity for receiving the specific integrated circuit being tested and electrically connecting the specific integrated circuit being tested to the second board.

3. The testing device of claim 1, further including a memory on the first board for storing data identifying the specific integrated circuit being tested.

4. The testing device of claim 3, wherein the MCU is programmed to control the testing of the specific integrated circuit being toted responsive to the data stored in the memory.

5. A testing device comprising:
a first board configured to connect a specific integrated circuit being tested;
a second board removably connected to the first board and configurable to test a plurality of integrated circuits;
an MCU located on the second board fin controlling the testing of the specific integrated circuit being tested; and
at least one connector for connecting the testing board to the second board;
wherein the at least one connector comprises a first connector of a first size configured to connect to the first board and a second connector of a second size configured to connect to the second board.

6. A testing device, comprising:
a first board configured to connect to a specific integrated circuit being tested;
a second board removably connected to the first board and configurable to test a plurality of integrated circuits;
an MCU located on the second board for configuring the testing of the specific integrated circuit being tested;
at least one connector for connecting the first board to the second board; and
a digital to analog convertor for providing a precision analog signal from the second board to the first board.

7. The testing device of claim 6, wherein the digital to analog convertor further comprises a 16-bit digital to analog convertor.

8. The testing device of claim 6, wherein the first board further includes a module connected to the first board, said module defining a cavity for receiving the specific integrated circuit being tested and electrically connecting the specific integrated circuit being tested to the second board.

9. The testing device of claim 6, further including a memory on the first board for storing data identifying the specific integrated circuit being tested.

10. The testing device of claim 9, wherein the MCU is programmed to control the testing of the specific integrated circuit being tested responsive to the data stored in the memory.

11. A testing device, comprising: a first board configured to connect to a specific integrated circuit being tested;
a second board removably connected to the first board and configurable to test a plurality of integrated circuits;
an MCU located on the second board for configuring the testing of the specific integrated circuit being tested;
at least one connector for connecting the first board to the second board; and
a universal serial bus bridge interfaced with the second board and enabling the second board to communicate with a universal serial bus connector.

12. The testing device of claim 11, wherein the first board further includes a module connected to the first board, said module defining a cavity for receiving the specific integrated circuit being tested and electrically connecting the specific integrated circuit being tested to the second board.

13. The testing device of claim 11, further including a memory on the first board for storing data identifying the specific integrated circuit being tested.

14. The testing device of claim 13, wherein the MCU is programmed to control the testing of the specific integrated circuit being tested responsive to the data stored in the memory.

15. A testing device, comprising:
a first board configured to connect to a specific integrated circuit being tested;
a second board removably connected to the first board and configurable to test a plurality of integrated circuits;
an MCU located on the second board for controlling the testing of the specific integrated circuit being tested;

at least one connected for connecting the first board to the second board; and a multiplexer interposing the MCU and the connector for multiplexing multiple signals from the MCU to the first board.

16. A testing device, comprising:
a first board configured to connect to a specific integrated circuit being tested;
a memory on the first board for storing data identifying the specific integrated circuit being tested;
a second board removably connected to the first board and configurable to test a plurality of integrated circuits;
a module connected to the first board, said module defining a cavity for receiving the specific integrated circuit being tested and electrically connecting the specific integrated circuit being tested to the second board;
an MCU located on the second board for configuring the testing of the specific integrated circuit being tested; and
at least one connector for connecting the first board to the second board.

17. The testing device of claim 16, wherein the MCU is programmed to control the testing of the specific integrated circuit being tested responsive to the data stored in the memory.

18. A testing device, comprising:
a first board configured to connect to a specific integrated circuit being tested;
a memory on the first board for storing data identifying the specific integrated circuit being tested;
a second board removably connected to the first board and configurable to test a plurality of integrated circuits;
a module connected to the first board, said module defining a cavity for receiving the specific integrated circuit being tested and electrically connecting the specific integrated circuit being tested to the second board;
an MCU located on the second board for controlling the testing of the specific integrated circuit being tested; and
at least one connector for connecting the first board to the second board;
wherein the at least one connector comprises a first connector of a first size configured to connect to the first board and a second connector of a second size configured to connect to the second board.

19. A testing device, comprising:
a first board configured to connect to a specific integrated circuit being tested;
a memory on the first board for storing data identifying the specific integrated circuit being tested;
a second board removably connected to the first board and configurable to test a plurality of integrated circuits;
a module connected to the first board, said module defining a cavity for receiving the specific integrated circuit being tested and electrically connecting the specific integrated circuit being tested to the second board;
an MCU located on the second board for controlling the testing of the specific integrated circuit being tested;
at least one connector for connecting the first board to the second board; and
a digital to analog convertor for providing a precision analog signal from the second board to the first board.

20. The testing device of claim 19, wherein the digital to analog convertor further comprises a 16-bit digital to analog convertor.

21. The testing device of claim 19, wherein the MCU is programmed to control the testing of the specific integrated circuit being tested responsive to the data stored in the memory.

22. The testing device of claim 19, wherein the at least one connector comprises a first connector of a first size configured to connect to the first board and a second connector of a second size configured to connect to the stored board.

23. The testing device of claim 19, further including a universal serial bus bridge interfaced with the second board and enabling the second board to communicate with a universal serial bus connector.

24. The testing device of claim 19, further including a multiplexor interposing the MCU and the connector for multiplexing multiple signals from the MCU to the first board.

25. A testing device, comprising:
a first board configured to connect to a specific integrated circuit being tested;
a memory on the first board for storing data identifying the specific integrated circuit being tested;
a second board removably connected to the first board and configurable to test a plurality of integrated circuits;
a module connected to the first board, said module defining a cavity for receiving the specific integrated circuit being tested and electrically connecting the specific integrated circuit being tested to the second board;
an MCU located on the second board for controlling the testing of the specific integrated circuit being tested;
at least one connector for connecting the first board to the second board; and
a universal serial bus bridge interfaced with the second board and enabling tho second board to communicate with a universal serial bus connector.

26. The testing device of claim 25, wherein the MCU is programmed to control the testing of the specific integrated circuit being tested responsive to the data stored in the memory.

27. The testing device of claim 25, wherein the at least one connector comprises a first connector of a first size configured to connect to the first board and a second connector of a second size configured to connect to the second board.

28. The testing device of claim 25 further comprising a digital to analog convertor for providing a precision analog signal from the second board to the first board.

29. The testing device of claim 28, wherein the digital to analog convertor further comprises a 16-bit digital to analog convertor.

30. The testing device of claim 25 further including a multiplexor interposing the MCU and the connector for multiplexing multiple signals from the MCU to the first board.

31. A testing device, comprising:
a first board configured to configured to connect a specific integrated circuit being tested;
a memory on the first board for storing data identifying the specific integrated circuit being tested;
a second board removably connected to the first board and configurable to test a plurality of integrated circuits;
a module connected to the first board, said module defining a cavity for receiving the specific integrated circuit being tested and electrically connecting the specific integrated circuit being tested to the second board;
an MCU located on the second board for configuring the testing of the specific integrated circuit being tested;
at least one connector for connecting the first board to the second board; and a multiplexer interposing the MCU and the connector for multiplexing multiple signals from the MCU to the first board.

32. The testing device of claim 31, wherein the MCU is programmed to control the testing of the specific integrated circuit being tested responsive to the data stored in the memory.

33. The testing device of claim 31, wherein the at least one connector comprises a first connector of a first size configured to connect to the first board and a second connector of a second size configured to connect to the second board.

34. The testing device of claim 31, further comprising a digital to analog convertor for providing a precision analog signal from the second board to the first board.

35. The testing device of claim 34, wherein the digital to analog convertor further comprises a 16-bit digital to analog convertor.

36. The testing device of claim 31, further including a universal serial bus bridge interfaced with the second board and enabling the second board to communicate with a universal serial bus connector.

37. A testing device, comprising:
a first board configured to connecting a specific integrated circuit being tested;
a second board removably connected to the first board and configurable to test a plurality of integrated circuits;
an MCU located for the second board for configuring the testing of the specific integrated circuit being tested;
a digital to analog convertor for providing a precision analog signal from the second board to the first board;
a multiplexer connected to the MCU for multiplexing multiple signals from the MCU to the first board;
a universal serial bus bridge interfaced with the second board enabling the second board to communicate with a universal serial bus connector; and
at least one connector for connecting the first board to the second board.

38. The testing device of claim 37, wherein the first board further comprises a module connected to the first board, said module defining a cavity for receiving the specific integrated circuit being tested and electrically connecting the specific integrated circuit being tested to the second board.

39. The testing device at claim 37, further including a memory on the first board for storing data identifying the specific integrated circuit being tested.

40. The testing device of claim 39, wherein the MCU is programmed to control the testing of the specific integrated circuit being tested responsive to data stored in the memory.

41. The testing device of claim 37, wherein the at least one connector comprises a first connector of a first size configured to connect to the first board and a second connector of a second size configured to connect to the second board.

42. The testing device of claim 37, wherein the digital to analog convertor further comprises a 16-bit digital to analog convertor.

43. A testing device, comprising:
a first board configured to connect to a specific integrated circuit being tested;
a memory on the first board for storing data identifying the specific integrated circuit being tested; and
at least one connector for connecting the first board to a second board configuring circuitry responsive to the data for testing the specific integrated circuit being tested;
wherein the at least one connector comprises a first connector of a first size configured to connect to the first board and a second connector of a second size configured to connect to the second board.

44. A testing device, comprising:
a second board for testing a plurality of integrated circuits;
an MCU located on the second board for configuring the testing of a specific integrated circuit being tested;
a digital to analog convertor for providing a precision analog signal from the second board to the first board;
a multiplexor connected to the MCU for multiplexing multiple signals from the MCU to a specific integrated circuit to be tested;
a universal serial bus bridge interfaced with the second board enabling the second board to communicate with a universal serial bus connector; and
at least one connector for communicating the first board to a second board containing the specific integrated circuit to be tested.

45. The testing device of claim 44, wherein the MCU is programmed to control the testing of the specific integrated circuit being tested responsive to data stored in a memory on the first board.

46. The testing device of claim 44, wherein the at least, one connector comprises a first connector of a first size configured to connect to the first board and a second connector of a second size configured to connecting the second board.

47. The testing device of claim 44, wherein the digital to analog convertor further comprises a 16-bit digital to analog convertor.

* * * * *